(12) United States Patent
Li et al.

(10) Patent No.: US 12,495,692 B2
(45) Date of Patent: Dec. 9, 2025

(54) DISPLAY SUBSTRATE, DISPLAY PANEL AND DISPLAY DEVICE

(71) Applicant: KunShan Go-Visionox Opto-Electronics Co., Ltd., Kunshan (CN)

(72) Inventors: Meijin Li, Kunshan (CN); Chuanzhi Xu, Kunshan (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 1104 days.

(21) Appl. No.: 17/361,818

(22) Filed: Jun. 29, 2021

(65) Prior Publication Data

US 2021/0327958 A1  Oct. 21, 2021

Related U.S. Application Data (63) Continuation of application No. PCT/CN2020/072274, filed on Jan. 15, 2020.

(30) Foreign Application Priority Data

Jun. 28, 2019 (CN) .......................... 201910580310.8

(51) Int. Cl.
    *H10K 59/35* (2023.01)
    *G09G 3/32* (2016.01)
    (Continued)

(52) U.S. Cl.
    CPC ............. *H10K 59/353* (2023.02); *G09G 3/32* (2013.01); *H10H 20/8312* (2025.01);
    (Continued)

(58) Field of Classification Search
    CPC .................................................. H10K 59/353
    See application file for complete search history.

(56) References Cited

U.S. PATENT DOCUMENTS 9,660,010 B2 * 5/2017 Park ................... H10K 59/1216
10,121,986 B2 * 11/2018 Lee ....................... H10K 59/122
(Continued)

FOREIGN PATENT DOCUMENTS

CN       104282724 A     1/2015
CN       105702205 A     6/2016
(Continued)

OTHER PUBLICATIONS https://forum.arduino.cc/t/matrix-5x5-with-transistors/114494 (Year: 2012).*

(Continued)

*Primary Examiner* — Vincent Wall
(74) *Attorney, Agent, or Firm* — Maier & Maier, PLLC (57) ABSTRACT

A display substrate, a display panel, and a display device. The display substrate includes a substrate, and further includes a first display region, a plurality of first sub-pixels located on the substrate are arranged in the first display region, and each of the plurality of first sub-pixels includes a first electrode, electrically connected to a corresponding pixel circuit via a wiring; a light-emitting structure, disposed on the first electrode; and a second electrode, disposed on the light-emitting structure; and a second display region, a light transmittance of the first display region being greater than a light transmittance of the second display region; wherein the first display region includes a conductive layer, the first electrode is electrically connected to the wiring via the conductive layer, and a conductive resistivity of the conductive layer is less than a conductive resistivity of the first electrode and a conductive resistivity of the wiring.

18 Claims, 6 Drawing Sheets

(51) Int. Cl.
   *H10H 20/831* (2025.01)
   *H10H 20/833* (2025.01)
   *H10H 20/855* (2025.01)
   *H10H 20/857* (2025.01)
   *H10H 29/14* (2025.01)
   *H10K 59/122* (2023.01)
   *H10K 59/131* (2023.01)
   *H10K 59/65* (2023.01)
   *H10K 59/80* (2023.01)

(52) U.S. Cl.
   CPC ........ *H10H 20/833* (2025.01); *H10H 20/855* (2025.01); *H10H 20/857* (2025.01); *H10H 29/142* (2025.01); *H10K 59/122* (2023.02); *H10K 59/1315* (2023.02); *H10K 59/8794* (2023.02); *H10K 59/65* (2023.02)

(56) References Cited

U.S. PATENT DOCUMENTS

| | | | |
|---|---|---|---|
| 2015/0008400 A1* | 1/2015 | Kim | H10K 50/824 438/34 |
| 2016/0155859 A1 | 6/2016 | Kimura et al. | |
| 2017/0162834 A1* | 6/2017 | Kim | H10K 50/805 |
| 2018/0005007 A1 | 1/2018 | Du et al. | |
| 2018/0294428 A1 | 10/2018 | Nishimura et al. | |
| 2019/0066545 A1 | 2/2019 | Jung et al. | |
| 2019/0393286 A1* | 12/2019 | Ding | H10K 59/131 |
| 2020/0104562 A1* | 4/2020 | Sung | H10K 59/1216 |
| 2020/0135817 A1* | 4/2020 | Wang | H10K 59/122 |

FOREIGN PATENT DOCUMENTS

| | | |
|---|---|---|
| CN | 108257514 A | 7/2018 |
| CN | 108376696 A | 8/2018 |
| CN | 108389879 A | 8/2018 |
| CN | 108922900 A | 11/2018 |
| CN | 109256047 A | 1/2019 |
| CN | 109273481 A | 1/2019 |
| CN | 109410823 A | 3/2019 |
| CN | 208608202 U | 3/2019 |
| CN | 208622778 U | 3/2019 |
| CN | 109600459 A | 4/2019 |
| CN | 109728046 A | 5/2019 |
| CN | 109801950 A | 5/2019 |
| CN | 208861990 U | 5/2019 |
| CN | 109859647 A | 6/2019 |
| CN | 110189639 A | 8/2019 |
| JP | 2005031645 A | 2/2005 |
| JP | 2010230797 A | 10/2010 |
| TW | 201839977 A | 11/2018 |
| WO | 2010070798 A1 | 6/2010 |
| WO | 2014103900 A1 | 7/2014 |
| WO | 2015060203 A1 | 4/2015 |
| WO | 2016042638 A1 | 3/2016 |
| WO | 2019062179 A1 | 4/2019 |

OTHER PUBLICATIONS

Extended European Search Report issued on Nov. 23, 2022, in corresponding European Patent Application No. 20832259.4; 10 pages.
Office Action mailed on Aug. 30, 2022 in corresponding Japanese Application No. 2021-551822, 8 pages (with English Translation).
Office Action and Search Report issued on Apr. 3, 2020 in corresponding Chinese application No. 201910580310.8; 23 pages.
International Search Report issued on Apr. 10, 2020 in corresponding International application No. PCT/ CN2020/072274; 5 pages.
Written Opinion of the International Searching Authority issued on Apr. 10, 2020 in corresponding International application No. PCT/ CN2020/072274; 8 pages.
Office Action issued on Oct. 23, 2020 in corresponding Taiwanese application No. 109103725; 5 pages.
Hu et al., "Electrical and Optical Characteristics of a Color ", Journal of Display Technology, vol. 9, No. 2, Feb. 2013; 6 pages.
Office Action issued on Mar. 15, 2022 in corresponding Indian Patent Application No. 202117038538; 6 pages.

* cited by examiner

DISPLAY SUBSTRATE, DISPLAY PANEL AND DISPLAY DEVICE

CROSS REFERENCE TO RELATED APPLICATIONS

The present application is a continuation application of PCT application under PCT/CN2020/072274, which claims the priority of Chinese patent application CN 201910580310.8 entitled with "DISPLAY SUBSTRATE, DISPLAY PANEL AND DISPLAY DEVICE" and filed with National Intellectual Property Administration, P.R.C. on Jun. 28, 2019, contents of which is incorporated herein by reference in entirety.

TECHNICAL FIELD

The present disclosure relates to the field of display technology, and in particular to a display substrate, a display panel, and a display device.

BACKGROUND

With the rapid development of electronic devices, users have more and more requirements on the screen-to-body ratio, which makes the full-screen display of electronic devices more and more concerned in the industry. Conventional electronic devices such as mobile phones and tablet computers are required to be integrated with front-facing cameras, earpieces and infrared sensing elements. Therefore, a notch is provided in the display panel for accommodating cameras, earpieces and infrared sensing elements, etc. However, an area of the notch, such as a notch screen, cannot be used to display images. Alternatively, a hole may be provided on the screen for accommodating the cameras. In this way, for the electronic devices implementing photographing function, external light may enter a photosensitive element disposed below the screen via the hole provided in the screen. These electronic devices are not full screens in the true sense, and images cannot be displayed in all areas of the entire screen, for example, images cannot be displayed in the camera area.

SUMMARY

According to a first aspect of the present disclosure, a display substrate is provided, and the display substrate includes a substrate. The display substrate includes a first display region and a second display region; a light transmittance of the first display region is greater than a light transmittance of the second display region. The first display region is provided with a plurality of first sub-pixels disposed on the substrate, and each of the plurality of first sub-pixels includes a first electrode, a light-emitting structure disposed on the first electrode, and a second electrode disposed on the light-emitting structure. The first electrode of the first sub-pixel is electrically connected to a corresponding pixel circuit via a wiring. The first display region further includes a conductive layer, the first electrode is electrically connected to the wiring via the conductive layer, and a conductive resistivity of the conductive layer is less than a conductive resistivity of the first electrode and a conductive resistivity of the wiring, respectively.

According to a second aspect of the present disclosure, a display substrate is provided. The display substrate includes a first display region and a second display region; a light transmittance of the first display region is greater than that of the second display region. A plurality of first sub-pixels are provided in the first display region, and each of the first sub-pixels includes a first electrode, a light-emitting structure disposed on the first electrode, and a second electrode disposed on the light-emitting structure, and the first electrode includes a plurality of two electrode blocks and at least one connecting portion. For each of the at least one connecting portion, the connecting portion electrically connects adjacent two electrode blocks. The light emitting structure includes a plurality of light emitting structure blocks disposed correspondingly on the plurality of electrode blocks. The at least one connecting portion of the first electrode and the plurality of electrode blocks are disposed on different layers, and an insulating layer is disposed between the at least one connecting portion and the plurality of electrode blocks, a contact hole is provided in the insulating layer, and the connecting portion is electrically connected to a corresponding electrode block via the contact hole. The display substrate further includes a pixel definition layer disposed on the first electrode, the pixel definition layer is provided with a pixel opening, and a distance between an edge of the contact hole and an edge of a corresponding pixel opening ranges from 4 μm to 30 μm.

According to a third aspect of the present disclosure, a display panel is provided, the display panel includes the above-mentioned display substrate and an encapsulation layer; the encapsulation layer includes a polarizer, and the polarizer covers the second display region or the polarizer covers the second display region and the first display region.

According to a fourth aspect of the present disclosure, there is provided a display device, including: a device body having a device area; the above-mentioned display panel, covering the device body; wherein the device area is disposed under the first display region, and the device area is provided with a photosensitive device that emits or collects light passing through the first display region.

DETAILED DESCRIPTION OF THE EMBODIMENTS

The exemplary embodiments will be described in detail here, and examples thereof are illustrated in the accompanying figures. When the following description refers to the accompanying figures, unless otherwise indicated, same reference signs in different figures designate same or similar elements. The implementation manners described in the following exemplary embodiments do not represent all implementation manners consistent with the present disclosure. On the contrary, they are only examples of devices that are consistent with some aspects of the disclosure as defined in the appended claims.

In smart electronic devices such as mobile phones and tablet computers, since it is necessary to integrate photosensitive devices such as front cameras and light sensors, a transparent display region is typically provided on the electronic devices, and the photosensitive devices are disposed under the transparent display region, thus, a full-screen display of electronic equipment can be realized while guaranteeing the proper operation of the photosensitive device.

However, when the electronic device is displaying, a temperature of the transparent display region is relatively high, or the pixels in the transparent display region cannot work normally. Typically, in order to increase a light transmittance of the transparent display region, the devices in the transparent display region, such as the anodes of the sub-pixels and wirings, are typically made of transparent oxide materials, and the anodes of the sub-pixels in the transparent display region are connected to the corresponding pixel circuits via the wirings. A conductive resistivity of the transparent oxide material is relatively high, and contact resistance between the anode of the sub-pixel and the wiring in the transparent display region is relatively large, which will cause heat generated during the transparent display region is operated to be relatively large, thereby making the temperature of the transparent display region relatively high. In this way, the proper operation of the electronic device may be affected, and the anode and the pixel circuit may not be electrically connected effectively, and the sub-pixels in the transparent display region may not display normally.

To solve the above-mentioned problems, embodiments of the present disclosure provide a display substrate, a display panel, and a display device.

The display substrate, the display panel, and the display device according to the embodiments of the present disclosure will be described in detail below with reference to the accompanying drawings. In a case of no conflict, features of the following embodiments and the following implementations may be supplemented to each other or combined with each other.

Figure 1:
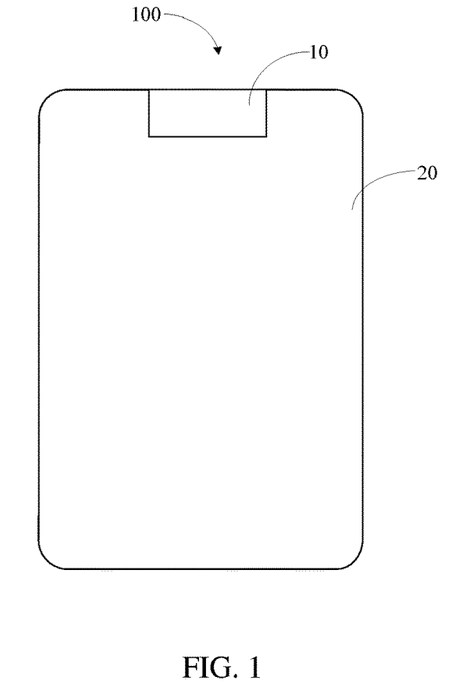
FIG. 1 illustrates a top view of a display substrate according to an embodiment of the present disclosure.

An embodiment of the present disclosure provides a display substrate. Referring to FIG. 1, the display substrate 100 includes a substrate 41, and the display substrate includes a first display region 10 and a second display region 20, a light transmittance of the first display region 10 is greater than a light transmittance of the second display region 20.

Figure 2:
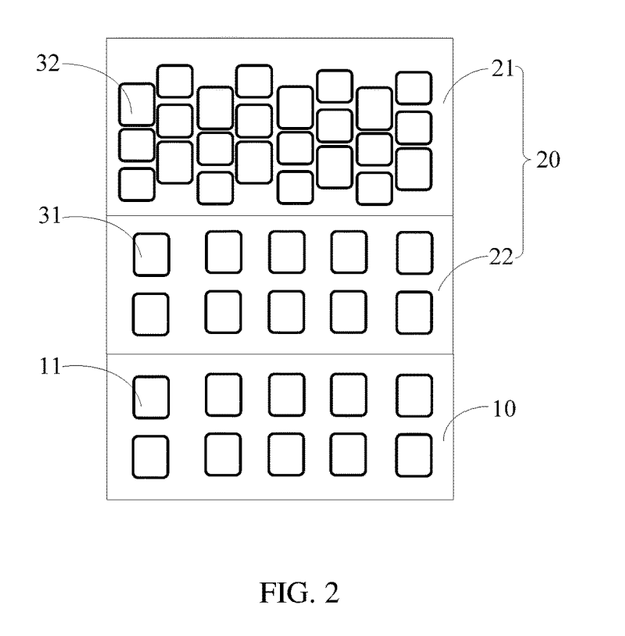
FIG. 2 illustrates a partial schematic view of an arrangement of sub-pixels in the display substrate as illustrated in FIG. 1.
Figure 4:
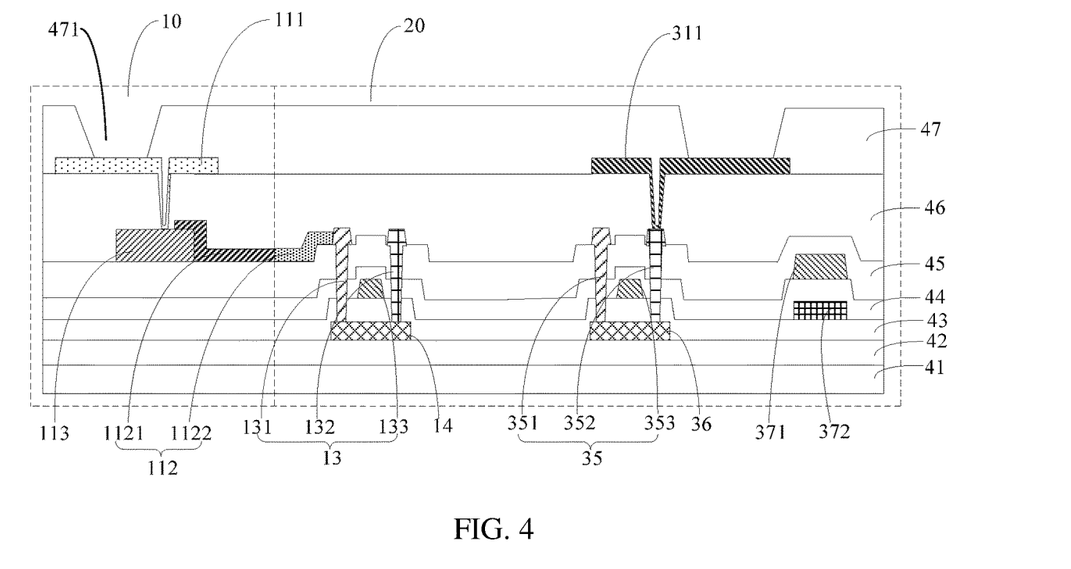
FIG. 4 illustrates a partial cross-sectional view of the display substrate as illustrated in FIG. 1.

Referring to FIGS. 2 and 4, a plurality of first sub-pixels 11 are provided on the substrate 41 in the first display region 10. Referring to FIG. 4, the first sub-pixel 11 includes a transparent first electrode 111, a light emitting structure (not shown) disposed on the first electrode 111, and a second electrode (not shown) disposed on the light emitting structure. The first electrode 111 of the first sub-pixel 11 is electrically connected to a corresponding pixel circuit via a wiring 112. A portion of the wiring 112 that contacts the first electrode 111 is made of a transparent conductive material. The first display region 10 further includes a conductive layer 113, and the first electrode 111 is electrically connected to the wiring 112 via the conductive layer 113. A conductive resistivity of the conductive layer 113 is less than a conductive resistivity of the first electrode 111 and a conductive resistivity of the wiring 112, respectively. In this way, since the light transmittance of the first display region is greater than the light transmittance of the second display region, a full-screen display of the display substrate can be achieved. And at the same time, the first electrode is configured to be electrically connected to the wiring via the conductive layer, that is, the first electrode and the wiring are not in direct contact, and the conductive resistivity of the conductive layer is less than the conductive resistivity of the first electrode and the conductive resistivity of the wiring respectively, which can reduce contact resistance between the first electrode and the wiring, and thus, heat generated in the first display region is reduced, and a temperature of the display substrate is decreased, thereby guaranteeing the proper operation of the display substrate.

Continuing to refer to FIG. 2 and FIG. 4, a pixel circuit for driving the first sub-pixel 11 is disposed in the second display region 20. The wiring 112 includes a first segment 1121 and a second segment 1122 connected to each other. A portion of the first segment 1121 that contacts the first electrode 111 is made of transparent conductive material, or entirety of the first segment 1121 is made of transparent conductive material. The first segment 1121 is disposed in the first display region 10, and the second segment 1122 is disposed in the second display region 20. The first electrode 111 is electrically connected to the first segment 1121 of the wiring 112 via the conductive layer 113.

In the display substrate 100 according to the embodiment of the present disclosure, since the pixel circuit for the first sub-pixel 11 in the first display region 10 is disposed in the second display region 20, complexity in structure of the first display region 10 can be reduced, and the diffraction effect generated by external light passing through the first display region 10 is reduced.

In an embodiment of the present disclosure, the pixel circuit corresponding to the first sub-pixel 11 may be a 1T circuit, a 2T1C circuit, a 3T1C circuit, a 7T1C circuit or a 7T2C circuit. A pixel circuit for a sub-pixel in the second display region 20 may be a 2T1C circuit, a 3T1C circuit, a 7T1C circuit, or a 7T2C circuit, where T represents a transistor, and C represents a storage capacitor. For example, the aforementioned 2T1C circuit refers to a pixel circuit including 2 transistors and 1 storage capacitor. The pixel circuit for the first sub-pixel 11 and the pixel circuit for the sub-pixel in the second display region 20 may be same or different.

Referring to FIG. 4, the sub-pixels in the second display region 20 may include a third electrode 311, a light-emitting structure (not shown) disposed on the third electrode 311, and a fourth electrode (not shown) disposed on the light-emitting structure. Both the first electrode 111 and the third electrode 311 may be anodes, both the second electrode and the fourth electrode may be cathodes, and the second electrode and the fourth electrode may be connected together so as to form a plane electrode.

Referring to FIG. 4 again, the display substrate 100 may further include a buffer layer 42 disposed on the substrate 41, a semiconductor layer 36 and a semiconductor layer 14 disposed on the buffer layer 42, and a gate insulating layer 43 disposed on the semiconductor layer 36 and the semiconductor layer 14, a capacitor insulating layer 44 disposed on the gate insulating layer 43, an interlayer dielectric layer 45 disposed on the capacitor insulating layer 44, a planarization layer 46 disposed on the interlayer dielectric layer 45, and a pixel definition layer 47 disposed on the planarization layer 46.

The pixel circuit for the first sub-pixel 11 may include a first transistor 13. The first transistor 13 includes a drain electrode 131, a source electrode 132 and a gate electrode 133. The gate electrode 133 is disposed between the gate insulating layer 43 and the capacitor insulating layer 44. Both the source electrode 132 and the drain electrode 131 are disposed on the interlayer dielectric layer 45 and are connected to the semiconductor 14 via a via passing through the gate insulating layer 43, the capacitor insulating layer 44 and the interlayer dielectric layer 45. The first electrode 111 is disposed between the planarization layer 46 and the pixel definition layer 47 and is partially exposed by the pixel opening 471 in the pixel definition layer 47. FIG. 4 illustrates the structure of the pixel circuit for the first sub-pixel 11 by taking the pixel circuit including the first transistor 13 as an example (that is, the pixel circuit for the first sub-pixel 11 being a 1T circuit), however, the pixel circuit for the first sub-pixel 11 may include more than one transistor, and may further include a capacitor.

The pixel circuit for the sub-pixel in the second display region 20 may include a second transistor 35 and a second capacitor. The second transistor 35 includes a source electrode 351, a drain electrode 352, and a gate electrode 353. The gate electrode 353 is disposed between the gate insulating layer 43 and the capacitor insulating layer 44, the source electrode 351 and the drain electrode 352 are disposed on the interlayer dielectric layer 45 and are connected to the semiconductor layer 36 via vias passing through the gate insulating layer 43, the capacitor insulating layer 44 and the interlayer dielectric layer 45. The second capacitor includes an upper electrode plate 371 and a lower electrode plate 372. The upper electrode plate 371 is disposed between the capacitor insulating layer 44 and the interlayer dielectric layer 45, and the lower electrode plate 372 is disposed between the gate insulating layer 43 and the capacitor insulating layer 44. The third electrode 311 is disposed between the planarization layer 46 and the pixel definition layer 47.

Figure 5:
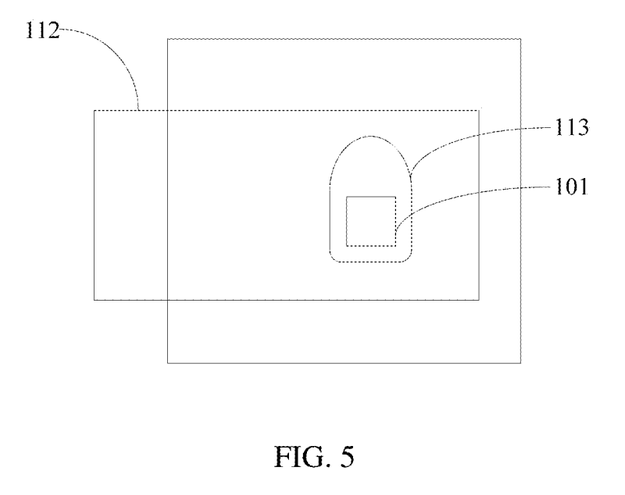
FIG. 5 illustrates a partial orthographic projection view of a device in the first display region of the display substrate as illustrated in FIG. 1 on the substrate.

In an embodiment of the present disclosure, referring to FIG. 4 again, the first electrode 111 is disposed on the conductive layer 113 and the first segment 1121 of the wiring 112, and a first insulating layer is disposed between the first electrode 111 and the first segment 1121. Referring to FIG. 5, a via 101 is provided in the first insulating layer, and the first electrode 111 contacts with or is connected to the conductive layer 113 via the via 101.

Furthermore, the conductive layer 113 and the drain electrode 131 of the first transistor 13 may be formed in a single process step. The conductive layer 113 and the drain electrode 131 of the first transistor 13 can be formed at the same time through a single process step, so that complexity of the manufacturing process for the display substrate 100 can be reduced. In this case, the first insulating layer between the first electrode 111 and the first segment 1121 may be the planarization layer 46. In other embodiments of the present disclosure, the conductive layer 113 may not be formed at the same time as the drain electrode 131 of the first transistor 13. For example, the conductive layer 113 may be formed after/before the drain electrode 131 of the first transistor 13.

Furthermore, the first segment 1121 of the wiring 112 may lap the conductive layer 113. With such an arrangement, the first segment 1121 of the wiring 112 and the conductive layer 113 are disposed on a same layer, and there is no need to provide a via in the first insulating layer to achieve connection between the first segment 1121 of the wiring 112 and the conductive layer 113, thereby further simplifying the preparing process.

Furthermore, the second segment 1122 of the wiring 112 and the drain electrode 131 of the first transistor 13 may be formed in a single processing step, thereby further simplifying the preparing process.

In an embodiment of the present disclosure, a light transmittance of the first electrode 111 and/or the first segment 1121 may be greater than 70%. And further, the light transmittance of the first electrode 111 and/or the first segment 1121 of the wiring 112 may be greater than or equal to 90%, for example, the light transmittance of the first electrode 111 and/or the first segment 1121 of the wiring 112 may be 90%, 95%, and etc. Such an arrangement can make the light transmittance of the first display region 10 greater, so that the light transmittance of the first display region 10 can meet the lighting requirements of, for example, a photosensitive device disposed therebelow.

In an embodiment of the present disclosure, a material of the first electrode 111 and/or a material of the first segment 1121 may include at least one of indium tin oxide, indium zinc oxide, silver-doped indium tin oxide, or silver-doped indium zinc oxide. For example, the material of the first electrode 111 and/or the first segment 1121 of the wiring 112 may be silver-doped indium tin oxide or silver-doped indium zinc oxide to reduce the resistance of the first electrode 111 and/or the first segment 1121 of the wiring 112 while ensuring a high transmittance of the first display region 10.

In an embodiment of the present disclosure, a material of the conductive layer 113 may include at least one of molybdenum, titanium, aluminum, magnesium, silver, gold, copper, zinc, chromium, nickel, or tungsten. The above-mentioned materials have low conductive resistivity and relatively stable properties. In a case that the conductive layer 113 and the drain electrode 131 of the first transistor 13 are prepared at the same time, the conductive layer 113 and the drain electrode 131 of the first transistor 13 may have a stacked structure, for example, the conductive layer 113 and the drain electrode 131 of the first transistor 13 may have a stacked structure with two titanium film layers and an aluminum film layer between the two titanium film layers.

In an embodiment of the present disclosure, the first segment 1121 of the wiring 112 and the second segment 1122 of the wiring 112 may be disposed on a same layer, and the first segment 1121 of the wiring 112 may lap the second segment 1122 of the wiring 112. This arrangement facilitates the connection of the first segment 1121 of the wiring 112 and the second segment 1122 of the wiring 112.

In an embodiment of the present disclosure, a material of the second electrode may include at least one of magnesium-silver, indium tin oxide, indium zinc oxide, silver-doped indium tin oxide, and silver-doped indium zinc oxide. Among them, magnesium-silver is a mixed material including magnesium and silver. With this arrangement, the light transmittance of the second electrode is relatively high, thereby increasing the light transmittance of the first display region 10.

In an embodiment of the present disclosure, a plurality of first sub-pixels 11 are disposed in the first display region 10, and the first electrode 111 of each first sub-pixel 11 is electrically connected to a corresponding wiring 112 via the conductive layer 113. Referring to FIG. 5, in an extending direction or a longitudinal direction of the conductive layer 113, a width of the conductive layer 113 can vary continuously or intermittently, so that a distance between two adjacent conductive layers 113 may be varied continuously or intermittently. With this arrangement, diffraction fringes generated at positions at different widths of the conductive layer 113 and diffraction fringes generated at positions at different distances between two adjacent conductive layers 113 are different, and diffraction intensities at different positions cancel each other out, thereby effectively reducing the diffraction effect, and thus it is ensured that, for example, an image taken by a camera disposed below the first display region 10 has a high definition.

Furthermore, in an extending direction of the conductive layer 113, an edge of the conductive layer 113 may be arc-shaped or wave-shaped at least partially. By setting the edge of the conductive layer 113 to be arc-shaped or wave-shaped, the width of the conductive layer 113 can be varied continuously or intermittently, so that the distance between two adjacent conductive layers 113 can be varied continuously or intermittently. A shape of a cross section of the conductive layer 113 may be a circle, an oval, or the like, for example.

In an embodiment of the present disclosure, referring to FIG. 2, the second display region 20 may include a first sub-display region 21 provided with a plurality of second sub-pixels 32 and a second sub-display region 22 contiguous to both the first sub-display region 21 and the first display region 10. The second sub-display region 22 is provided with a plurality of third sub-pixels 31. A pixel circuit for the first sub-pixel 11 may be disposed in the second sub-display region 22. Such an arrangement can make a length of a wiring 112 for connecting the first electrode 111 and a corresponding pixel circuit relatively short, which is beneficial to reduce complexity of the wiring in the display substrate 100.

Furthermore, a pixel circuit for the third sub-pixel 31 is disposed in an area of the second sub-display region 22 adjacent to the first sub-display region 21, and a pixel circuit for the first sub-pixel 11 may be disposed in an area of the second sub-display region 22 adjacent to the first display region 10. With such an arrangement, the pixel circuit for the first sub-pixel 11 and the pixel circuit of the third sub-pixel 31 are reasonably arranged in the second sub-display region 22, so that a distance between the first electrode 111 of the first sub-pixel 11 and the corresponding pixel circuit is relatively short, so that the length of the wiring 112 for connecting the first electrode 111 and the corresponding pixel circuit is relatively short, which is beneficial to reduce complexity of the wiring in the display substrate 100.

In an embodiment of the present disclosure, a density of the first sub-pixel 11 may be same as a density of the third sub-pixel 31 and is less than a density of the second sub-pixel 32. The density of the first sub-pixel 11 is the same as the density of the third sub-pixel 31, so that the display effects of the first display region 10 and the second sub-display region 22 are more similar, thereby reducing probability that display effects of the display regions are different due to diversification of pixel density in the display regions of the display substrate 100.

Furthermore, the density of the third sub-pixel 31 may be equal to a half of the density of the second sub-pixel 32. By setting the density of the third sub-pixel 31 equal to the half of the density of the second sub-pixel 32, the pixel circuit for the first sub-pixel 11 and the pixel circuit for the third sub-pixel 31 can each occupy a half area of the second sub-display region 22, so that the pixel circuit for the first sub-pixel 11 and the pixel circuit for the third sub-pixel 31 are arranged more reasonably in the second sub-display region 22.

Furthermore, a distance between adjacent third sub-pixels 31 in the second sub-display region 22 is greater than a distance between adjacent second sub-pixels 32 in the first sub-display region 21, and/or, a size of the second sub-pixel 32 is smaller than a size of the third sub-pixel 31. With such a configuration, the density of the second sub-pixels 32 in the first sub-display region 21 may be greater than the density of the third sub-pixels 31 in the second sub-display region 22.

Figure 3:
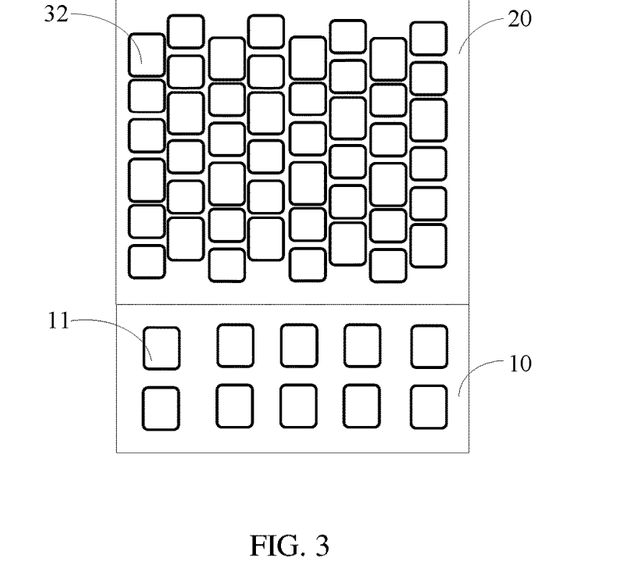
FIG. 3 illustrates a partial schematic view of another arrangement of the sub-pixels in the display substrate as illustrated in FIG. 1.

In another embodiment of the present disclosure, referring to FIG. 3, only the second sub-pixels 32 are disposed in the second display region 20, and the second sub-pixels 32 may be uniformly distributed in the second display region 20, that is, the density of the second sub-pixels 32 is substantially the same throughout the display region 20.

Furthermore, the pixel circuit for the first sub-pixel 11 in the first display region 10 is arranged in an area of the second display region 20 adjacent to the first display region 10 so as to reduce a length of the wiring 112, thereby reducing complexity of wiring within the display substrate 100.

In an embodiment of the present disclosure, each first electrode 111 may include at least one electrode block, and the light emitting structure disposed on the first electrode 111 may include at least one light emitting structure block disposed correspondingly on the electrode block, wherein, there are plurality of electrode blocks of the same first electrodes 111, the light-emitting structure blocks disposed correspondingly on the plurality of electrode blocks have a same color.

Figure 6:
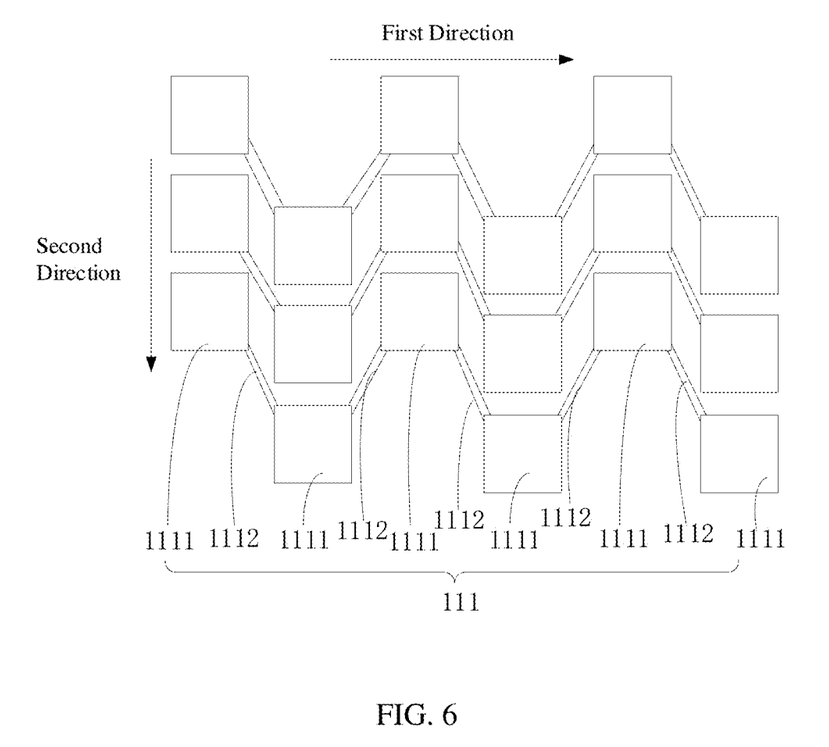
FIG. 6 illustrates a schematic view of an orthographic projection of the first electrode of the first display region of the display substrate as illustrated in FIG. 1 on the substrate.
Figure 7:
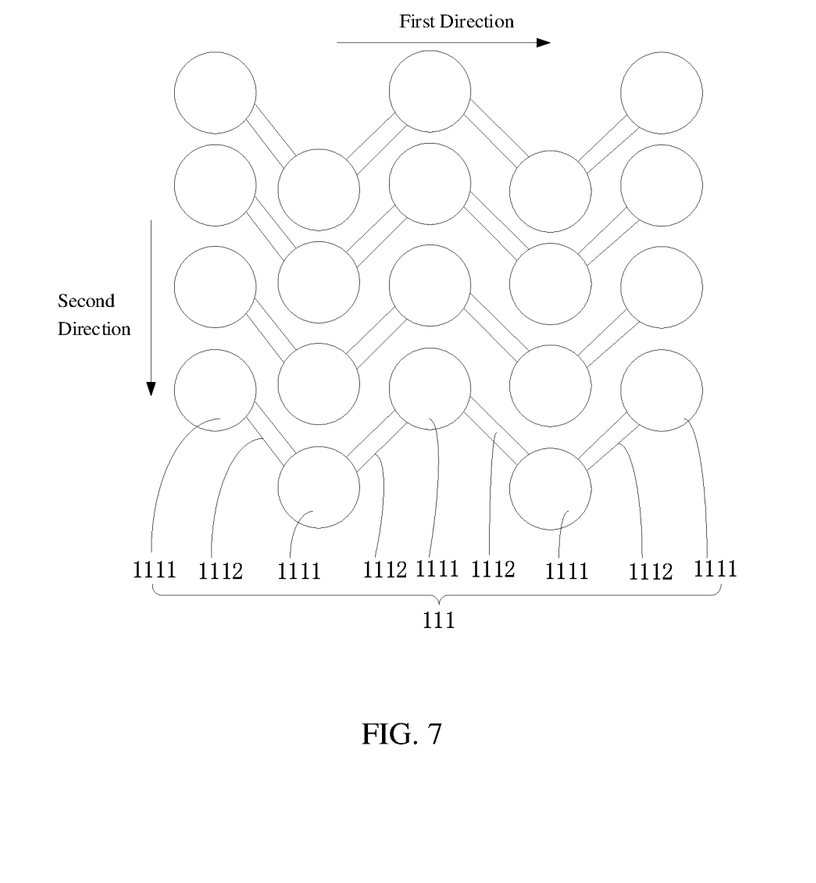
FIG. 7 illustrates a schematic view of another orthographic projection of the first electrode in the first display region of the display substrate as illustrated in FIG. 1 on the substrate.
Figure 8:
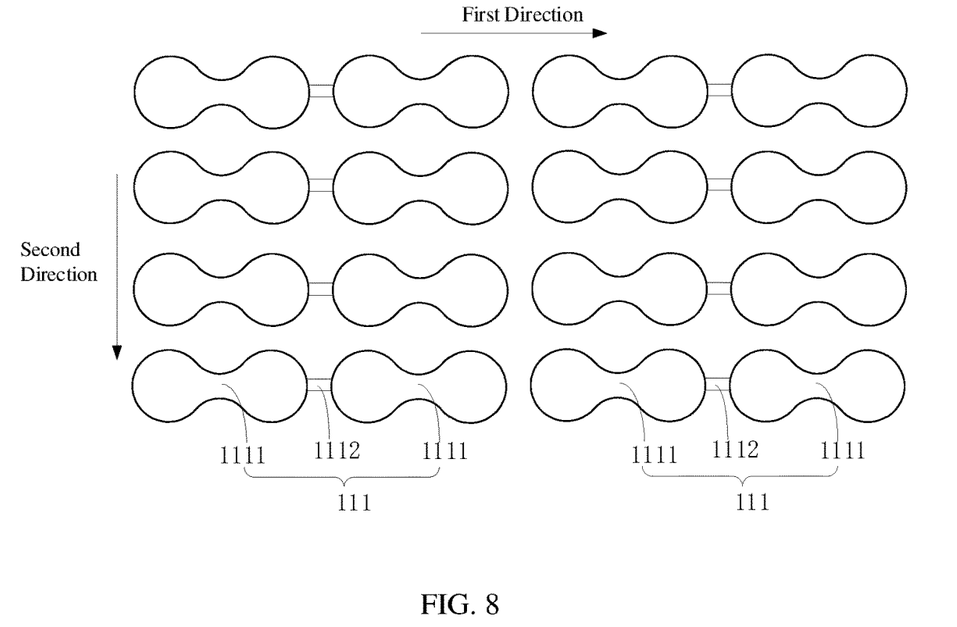
FIG. 8 illustrates another schematic view of an orthographic projection of the first electrode in the first display region of the display substrate as illustrated in FIG. 1 on the substrate.

Referring to FIGS. 6 to 8, the first electrode 111 includes plurality of electrode blocks 1111, the plurality of electrode blocks 1111 are arranged at intervals in the first direction, and the first electrode 111 further includes a connecting portion 1112 disposed between two adjacent electrode blocks 1111, and two adjacent electrode blocks 1111 are electrically connected by a corresponding connecting portions 1112. With such an arrangement, the plurality of electrode blocks 1111 of the first electrode 111 can be driven by one pixel circuit, thereby reducing complexity in structure of the first display region 10 and effectively mitigating diffraction superposition generated by light passing the first display region due to the complex structure of the first display region 10, and further improving quality of an image taken by, for example, a camera disposed under the first display region 10 and avoiding image distortion defects. In addition, the plurality of electrode blocks 1111 of the same first electrode 111 are electrically connected, so that the light-emitting structure blocks disposed correspondingly on the plurality of electrode blocks 1111 of the same first electrode 111 can be controlled to emit light or be turned off at the same time, thus control of display region 10 can be simplified.

In an embodiment of the present disclosure, the first electrode 111 includes a plurality of electrode blocks 1111, the wiring 112 corresponding to the first electrode 111 may be electrically connected to one electrode block 1111 of the first electrode 111. Since the plurality of electrode blocks 1111 of the same first electrode 111 are electrically connected, as long as one of the electrode blocks 1111 is connected to the wiring corresponding to the first electrode 111, it can be ensured that respective electrode blocks 1111 of the first electrode 111 are driven by one pixel circuit.

In an embodiment of the present disclosure, the first electrode 111 includes a plurality of electrode blocks 1111, the wiring 112 for the first electrode 111 may be connected to an electrode block 1111 of the first electrode 111 adjacent to the second sub-display region 22. This arrangement can further reduce the length of the first segment 1121 of the wiring 112, which helps to further reduce the diffraction effect generated by light passing through the first display region 10.

In an embodiment of the present disclosure, in the display substrate 100, the first electrode 111 is disposed on the substrate, and an orthographic projection of the electrode block 1111 on the substrate may include a first graphic unit or a plurality of first graphic units. The first graphic unit may include a circle, an oval, a dumbbell, a gourd or a rectangle.

The first display region 10 as illustrated in FIG. 6 is provided with a first electrode 111 in the first direction, the first electrode 111 includes six electrode blocks 1111, and an orthographic projection of each of the electrode blocks 1111 on the substrate may include a first graphic unit, and the first graphic unit has a rectangular shape. The first display region 10 as illustrated in FIG. 7 is provided with a first electrode 111 in the first direction. The first electrode 111 includes five electrode blocks 1111, and an orthographic projection of each of the electrode blocks 1111 on the substrate can include a first graphic unit, and the first graphic unit is circular. The first display region 10 as illustrated in FIG. 8 is provided with two first electrodes 111 in the first direction. Each of the first electrodes 111 includes two electrode blocks 1111. An orthographic projection of each of the electrode blocks 1111 on the substrate may include a first graphic unit, and the graphic unit is dumbbell-shaped. The first graphic unit may be circular, oval, dumbbell-shaped or gourd-shaped. The above-mentioned shape can change the periodic structure generated by diffraction, that is, the distribution of the diffraction field is changed, thereby reducing the diffraction effect generated by external light passing through the first display region. In addition, in a case that the first graphic unit has the above-mentioned shape, a size of the first electrode in the second direction varies continuously or intermittently, and a distance between two adjacent first electrodes in the first direction varies continuously or intermittently in the second direction, so that positions of the two adjacent first electrodes that generate diffraction are different, and intensities of the diffractions at different positions cancel each other. It can effectively reduce the diffraction effect, thereby ensuring, for example, that an image taken by the camera disposed under the first display region has a high definition.

In an embodiment of the present disclosure, referring to FIGS. 6 and 7, for the plurality of electrode blocks 1111 of one first electrode 111, two adjacent electrode blocks 1111 are staggered in a second direction. The second direction is perpendicular to the first direction. Such a configuration can further reduce the diffraction effect generated by the externally incident light passing through the first display region.

In an embodiment of the present disclosure, referring to FIGS. 6 and 7, for the plurality of electrode blocks 1111 of one first electrode 111, central axis of the two electrode blocks 1111 separated by one electrode block 1111 in the first direction coincide. Such an arrangement can make the arrangement of the electrode blocks 1111 more regular, so that arrangement of light-emitting structure blocks disposed correspondingly on the plurality of electrode blocks 1111 is more regular, and arrangement of openings of the mask for preparing the light-emitting structure blocks is more regular. In a case that the light-emitting structure blocks in the first display region 10 and the second display region 20 are vapor-deposited, the light-emitting structure blocks in the first display region 10 and in the second display region 20 may be fabricated in a single vapor deposition process through one mask. Because the pattern of the mask corresponding to the first display region is relatively uniform, the wrinkles of screening can be reduced.

In an embodiment of the present disclosure, an orthographic projection of the light-emitting structure block on the substrate may include a second graphic unit or a plurality of second graphic units, and the second graphic unit and the first graphic unit may be the same or different. In a case that the first graphic unit is different from the second graphic unit, the orthographic projection of the light-emitting structure block disposed correspondingly on the electrode block 1111 on the substrate is different from the orthographic projection of the electrode block 1111 on the substrate, which further reduces diffraction effect generated by light passing through the first display region 10.

The second graphic unit may include circle, oval, dumbbell, gourd or rectangle.

In an embodiment of the present disclosure, the first direction and the second direction may be perpendicular to each other, wherein the first direction may indicate a row direction, and the second direction may indicate a column direction, or alternatively, the first direction may indicate a column direction, and the second direction may indicate a row direction. FIGS. 6 to 8 illustrate only by taking the first direction being the row direction and the second direction being the column direction as an example, and other cases will not be illustrated.

In an embodiment of the present disclosure, the first electrode 111 includes a plurality of electrode blocks 1111, the connecting portion 1112 and the electrode blocks 1111 of the first electrode 111 may be disposed on the same layer. With such an arrangement, the electrode blocks 1111 and the connecting portion 1112 may be formed in a single processing step, which is beneficial to reduce the processing complexity.

Furthermore, a size of the connecting portion 1112 in a direction perpendicular to its extending direction or perpendicular to its longitudinal direction may be greater than 3 μm, and be less than a half of a maximum size of the electrode block 1111. By setting the size of the connecting portion 1112 in the direction perpendicular to its extending direction to be greater than 3 μm, a resistance of the connecting portion 1112 can be made relatively small. By setting the size of the connecting portion 1112 to be less than a half of the maximum size of the electrode block 1111, the setting of the connecting portion 1112 can have a small effect on the size of the electrode block 1111, and it is avoided that a relatively large size of the connecting portion 1112 makes the size of the electrode block 1111 decrease, which in turn causes effective light-emitting area of the first display region 10 to be reduced.

In another embodiment of the present disclosure, when the first electrode 111 includes a plurality of electrode blocks 1111, the connecting portion 1112 and the electrode block 1111 of the first electrode 111 may be disposed on different layers, for example, the connecting portion 1111 is disposed on a layer, and the connecting portion 1112 is disposed on another layer. A second insulating layer is disposed between the connecting portion 1112 and the electrode block 1111, a contact hole is provided in the second insulating layer, and the connecting portion 1112 is electrically connected to the electrode block 1111 via a corresponding contact hole. With such an arrangement, a size of the electrode block 1111 is not affected by the connecting portion 1112, so that the size of the electrode block 1111 can be made relatively large, and effective light-emitting area of the first display region 10 is relatively large.

Furthermore, the pixel circuit for the first sub-pixel 11 may include a capacitor, and the connecting portion 1112 and an upper plate of the capacitor may be formed in a single process step. With such an arrangement, the connecting portion 1112 and the upper electrode plate of the capacitor can be formed at the same time through a single process step, which helps to reduce complexity of the process. In this case, the second insulating layer between the electrode block 1111 and the connecting portion 1112 includes the interlayer dielectric layer 45 and the planarization layer 46. In other embodiments of the present disclosure, the connecting portion 1112 may not be formed in a same process step as the upper plate of the capacitor, for example, it may be formed before or after the upper plate of the capacitor. A material of the connecting portion 1112 may also be a transparent conductive material, such as indium tin oxide, indium zinc oxide, silver-doped indium tin oxide, or silver-doped indium zinc oxide.

Figure 9:
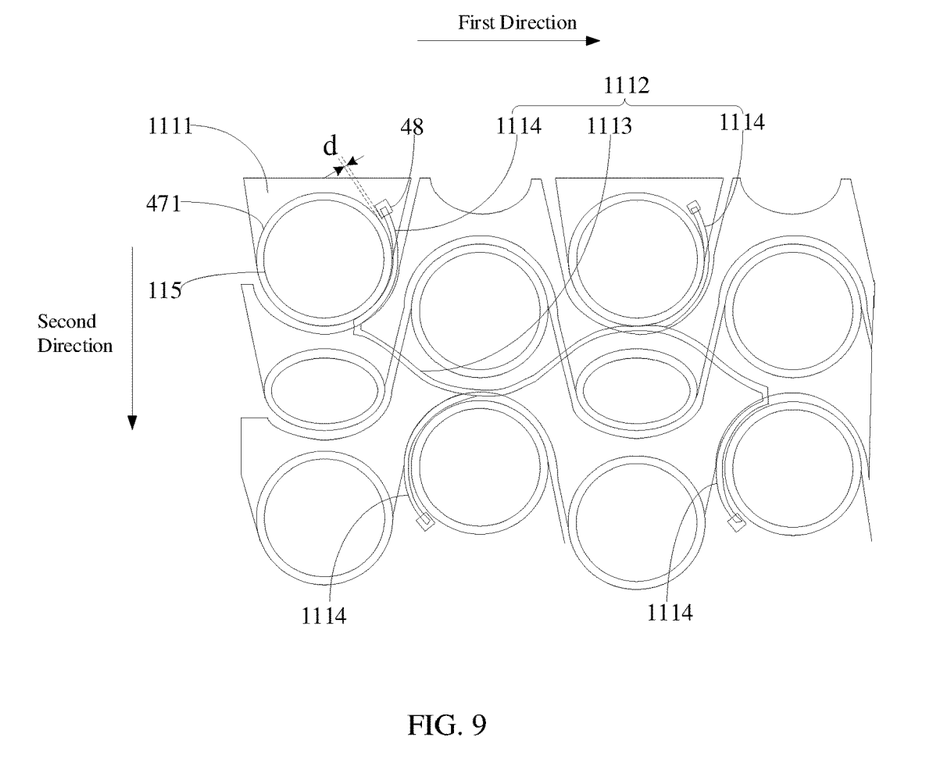
FIG. 9 illustrates a partial orthographic projection of a device in the first display region of the display substrate as illustrated in FIG. 1 on the substrate.

Furthermore, referring to FIGS. 4 and 9, the pixel definition layer 47 is provided with a plurality of pixel openings 471, the light-emitting structure blocks 115 are provided in the pixel openings 471 in a one-to-one correspondence, and a distance d between a contact hole 48 provided in the second insulating layer and the pixel opening 471 may range from 4 µm to 30 µm. An effective light-emitting area of the first sub-pixel 11 is an area of the pixel opening 471. In a case that the connecting portion 1112 is disposed under the pixel opening 471, recess may occur to the contact hole 48 corresponding to the electrode block 1111, and the light-emitting structure block 115 may enter the recess, which cause problems such as recesses, degradation, and point defects in the light-emitting structure block 115, thereby degrading display quality of the display substrate. The distance between an edge of the contact hole 48 and an edge of the pixel opening 471 is set to be from 4 µm to 30 µm, that is, the contact hole 48 is not disposed below the pixel opening 471. For example, an orthographic projection of the contact hole 48 on the substrate 41 and an orthographic projection of the pixel opening 471 on the substrate 41 do not coincide. In this way, recess of the electrode block 1111 under the pixel opening 471 can be avoided, and problems such as recess, degradation, and point defects of the light-emitting structure block 115 can be avoided, and display quality of the display substrate can be guaranteed.

The distance between the edge of the contact hole 48 and the edge of the pixel opening 471 refers to a minimum distance between an edge of the contact hole 48 and an adjacent edge of the pixel opening 471.

Furthermore, the distance d between the contact hole 48 and the pixel opening 471 may range from 4 µm to 8 µm. By setting the distance d between the edge of the contact hole 48 and the edge of the pixel opening 471 to be greater than 4 µm, it can be avoided that the pixel opening 471 is offset in a case of forming the pixel opening 471 on the pixel definition layer 47 due to errors in the processing, thereby making that pixel opening 471 that is formed over the contact hole 48 located on the contact hole 48. For example, an orthographic projection of the pixel opening 471 on substrate 41 and an orthographic projection of the contact hole 48 on the substrate 41 coincide. By setting the distance d between the edge of the contact hole 48 and the edge of the pixel opening 471 to be less than 8 µm, influence of the setting of the distance d on the effective light-emitting area of the first display region 10 can be reduced.

In an embodiment of the present disclosure, referring to FIG. 9 again, the connecting portion 1112 may include a third segment 1113 and a plurality of fourth segments 1114 connected to the third segment 1113. The third segment 1113 may extend in the first direction, and the fourth segment 1114 extends in a second direction. A plurality of the fourth segments 1114 are arranged at intervals in the first direction, and the third segment 1113 and the fourth segments 1114 are arc-shaped or wave-shaped.

The third segment 1113 is configured to connect a plurality of fourth segments 1114. The fourth segments 1114 are configured to connect to a corresponding electrode block 1111 via the contact hole 48. A plurality of electrode blocks 1111 of one first electrode 111 can be electrically connected via the third segment 1113 and the fourth segments 1114.

By setting the third segment 1113 and the fourth segment 1114 to be arc-shaped or wave-shaped, intensity of diffraction generated by external light incident on the first display region 10 can be reduced.

In an embodiment of the present disclosure, the fourth segment 1114 may be arc-shaped, and the fourth segment 1114 may be disposed around the pixel opening 471. Furthermore, a cross section of the pixel opening 471 may be circular, the fourth segment 1114 may be arc-shaped, and a center of an orthographic projection of the fourth segment 1114 on the substrate 41 and a center of an orthographic projection of the pixel opening 471 on the substrate 41 may not coincide, thereby reducing the diffraction effect generated by light passing through the first display region 10. However, in other embodiments of the present disclosure, the center of the orthographic projection of the fourth segment 1114 on the substrate and the center of the orthographic projection of the pixel opening 471 on the substrate may coincide.

An embodiment of the present disclosure further provides a display substrate, the display substrate includes a first display region and a second display region, and a light transmittance of the first display region is greater than a light transmittance of the second display region.

A plurality of first sub-pixels are provided in the first display region, and each of the plurality of first sub-pixels includes a first electrode, a light-emitting structure disposed on the first electrode, and a second electrode disposed on the light-emitting structure. Referring to FIG. 9, the first electrode includes a plurality of electrode blocks 1111 and at least one connecting portion 1112. Two adjacent electrode blocks 1111 are electrically connected via the connecting portion 1112. The light emitting structure includes a plurality of the light-emitting structure block disposed correspondingly on the plurality of electrode blocks.

The connecting portion 1112 of the same first electrode and the electrode blocks 1111 are disposed on different layers, an insulating layer is disposed between the connecting portion 1112 and the electrode blocks 1111, and a contact hole 48 is disposed on the insulating layer. The connecting portion 1112 is electrically connected to the electrode blocks 1111 via a corresponding contact hole 48. The display substrate further includes a pixel definition layer disposed on the first electrode, the pixel definition layer is provided with a plurality of pixel openings 471, and the plurality of light-emitting structure blocks are arranged in the plurality of pixel openings 471 in a one-to-one correspondence. The distance between an edge of the contact hole 48 and an edge of a corresponding pixel opening 471 ranges from 4 µm to 30 µm.

The distance between the edge of the contact hole 48 and the edge of the corresponding pixel opening 471 refers to the minimum distance between an edge of the contact hole 48 and the adjacent edge of the pixel opening 471.

In the display substrate according to the embodiments of the present disclosure, the distance between the edge of the contact hole 48 and the edge of the pixel opening 471 ranges from 4 µm to 30 µm, that is, the contact hole 48 is not located under the pixel opening 471, for example, an orthographic projection of the contact hole on the substrate and an orthographic projection of the pixel opening on the substrate do not coincide. In this way, recession of the electrode block 1111 under the pixel opening 471 can be avoided, and problems such as recession, degradation, and point defects of the light-emitting structure blocks 115 can be avoided, and the display quality of the display substrate can be ensured.

Furthermore, the distance between the edge of the contact hole 48 and the edge of the pixel opening 471 ranges from 4 µm to 8 µm. By setting the distance d between the edge of the contact hole 48 and the edge of the pixel opening 471 to be greater than 4 µm, it can be avoided that the pixel opening shift occurs due to fabricating errors when the pixel opening 471 is formed on the pixel definition layer 47, so that the pixel opening 471 formed on the contact hole 48 is located above the contact hole 48, for example, the orthographic projection of the pixel opening on the substrate and the orthographic projection of the contact hole on the substrate coincide. By setting the distance d between the edge of the contact hole 48 and the edge of the pixel opening 471 to be less than 8 µm, influence of the setting of the distance d on effective light-emitting area of the first display region 10 can be reduced.

The structure of the display substrate in the embodiment of the present disclosure may be the same as the related structure of the above-mentioned display substrate 100. The details may be referred to the above-mentioned embodiment and will not be elaborated here.

The first display region 10 of the display substrate 100 according to the embodiments of the present disclosure may have a shape such as a drop shape, a circle, a rectangle, a semicircle, a semi-oval, or an oval. But it is not limited to this, and alternatively, the first display region can be designed in other shapes according to actual requirements.

An embodiment of the present disclosure further provides a display panel, which includes the display substrate as described in any of the above embodiments and an encapsulation layer. The encapsulation layer is disposed on a side of the display substrate away from the substrate.

The encapsulation layer may include a polarizer, and the polarizer may cover the second display region 20, or the polarizer may cover the second display region 20 and the first display region 10. The polarizer can dissipate the reflected light on the surface of the display panel and improve the user experience.

In a case that the polarizer does not cover the first display region 10, for example, a photosensitive device that emits or collects light passing through the first display region 10 may be disposed under the first display region 10. In a case that the first display region 10 is not provided with a polarizer, a light transmittance of the first display region 10 can be increased, and the proper operation of the photosensitive device, for example, disposed under the first display region 10, can be ensured.

In the display panel according to the embodiments of the present disclosure, since the light transmittance of the first display region is greater than the light transmittance of the second display region, a full-screen display of the display substrate can be realized. By setting the first electrode to be electrically connected to the wiring via the conductive layer, that is, the first electrode and the wiring are not in direct contact, and the conductive resistivity of the conductive layer is less than the conductive resistivity of the first electrode and the conductive resistivity of the wiring respectively, the contact resistance between the electrode and the wiring can reduce the heat generated in the first display region, thereby reducing the temperature of the display panel, and ensuring the proper operation of the display panel.

Figure 10:
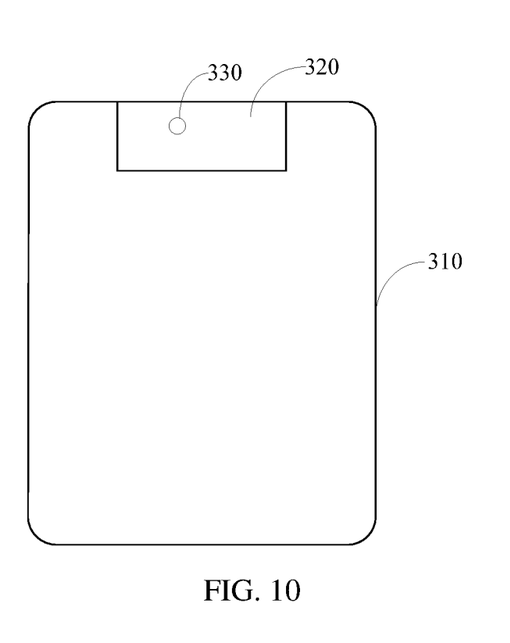
FIG. 10 illustrates a schematic structural view of a device body of the display device according to an embodiment of the present disclosure.

An embodiment of the present disclosure further provides a display device, which includes an equipment body and the display panel 10 as described above, the device body 310 has a device area 320, and the display panel covers the device body 310. The device area 320 is disposed under the first display region 10, and the device area 320 is provided with a photosensitive device 330 that collects light passing through the first display region 10.

The photosensitive device may include a camera and/or a light sensor. Other devices other than photosensitive devices, such as gyroscopes or earpieces, can further be disposed in the device area. The device area may be a notched area, and the first display region of the display panel may be arranged in close contact with the notched area, so that the photosensitive device can emit or collect light passing through the first display region.

The above-mentioned display device may be a digital device such as a mobile phone, a tablet, a palmtop computer, and an iPad.

In the display device according to the embodiments of the disclosure, since the light transmittance of the first display region is greater than the light transmittance of the second display region, the photosensitive device can be disposed under the first display region, such that full screen display of the display substrate can be achieved in a case of guaranteeing the proper operation of the photosensitive device. At the same time, by electrically connecting the first electrode and the wiring via the conductive layer, that is, the first electrode and the wiring are not in direct contact, and the conductive resistivity of the conductive layer is lower than the conductive resistivity of the first electrode and the conductive resistivity of the wiring, respectively, the contact resistance between the first electrode and the wiring can be reduced, thus the heat generated in the first display region can be reduced, thereby decreasing the temperature of the display substrate, and guaranteeing the proper operation of the display device.

It should be noted that in the drawings, the sizes of layers and regions may be exaggerated for clarity of illustration. It should further be understood that in a case that an element or layer is referred to as being "on" another element or layer, it can be directly on the other element or an intervening layer may be present. In addition, it should be understood that in a case that an element or layer is referred to as being "under" another element or layer, it can be directly under the other element, or there may be more than one intervening layer or element. In addition, it should further be understood that in a case that a layer or element is referred to as being "between" two layers or two elements, it can be the only layer between the two layers or two elements, or more than one intervening layers or components may be present. Similar reference numerals indicate similar elements throughout the specification.

In the present invention, the terms "first" and "second" are only used for descriptive purposes, and cannot be understood as indicating or implying relative importance. The term "plurality" refers to two or more, unless specifically defined otherwise.

One of ordinary skill in the art will easily conceive of other embodiments of the present invention after considering the description and practicing the disclosure disclosed herein. The present invention is intended to cover any variations, applications or modifications of the present invention. These variations, applications or modifications follow the general principles of the present invention and include common knowledge or conventional technical means in the technical field not disclosed by the present invention. The description and the embodiments are to be regarded as exemplary only, and the true scope and spirit of the present disclosure are limited by the following claims.

It should be understood that the present disclosure is not limited to the precise structure described above and illustrated in the drawings, and various modifications and changes can be made without departing from its scope. The scope of the present invention is only defined by the appended claims.

The invention claimed is:

1. A display substrate comprising a substrate, and further comprising:
   a first display region, wherein a plurality of first sub-pixels are located on the substrate, and each of the plurality of first sub-pixels comprises:
   a first electrode, electrically connected to a corresponding pixel circuit via a wiring; and
   a second display region, a light transmittance of the first display region being greater than a light transmittance of the second display region;
   wherein a pixel circuit for driving the first sub-pixel is disposed in the second display region,
   the second display region comprises a first sub-display region and a second sub-display region, the first sub-display region is provided with a plurality of second sub-pixels, the second sub-display region is disposed contiguous to both the first sub-display region and the first display region, the second sub-display region is provided with a plurality of third sub-pixels, and a pixel circuit for the plurality of first sub-pixels are disposed in the second sub-display region; and
   wherein the first display region further comprises a conductive layer, the first electrode is electrically connected to the wiring via the conductive layer, a conductive resistivity of the conductive layer is less than a conductive resistivity of the first electrode and a conductive resistivity of the wiring; the wiring comprises a first segment and a second segment connected with each other, the first segment is disposed in the first display region, the second segment is disposed in the second display region, and the first electrode is electrically connected to the first segment via the conductive layer.

2. The display substrate according to claim 1, wherein the first electrode is disposed on the conductive layer and the first segment, and the display substrate further comprises a first insulating layer disposed between the first electrode and the first segment, the first insulating layer comprises a via hole, and the first electrode contacts with the conductive layer via the via hole.

3. The display substrate according to claim 1, wherein a light transmittance of the first segment is greater than 70%, and/or a light transmittance the first electrode is greater than 70%.

4. The display substrate according to claim 1, wherein a material of the conductive layer comprises at least one of molybdenum, titanium, aluminum, magnesium, silver, gold, copper, zinc, chromium, nickel, and tungsten; and
   a material of the first segment and/or the first electrode comprises at least one of indium tin oxide, indium zinc oxide, silver-doped indium tin oxide, and silver-doped indium zinc oxide.

5. The display substrate according to claim 1, wherein a width of the conductive layer varies continuously or intermittently in an extending direction of the conductive layer.

6. The display substrate according to claim 1, wherein a density of the plurality of first sub-pixels is same as a density of the plurality of third sub-pixels, and is less than a density of the plurality of second sub-pixels; and/or
   the density of the third sub-pixel is equal to a half of the density of the second sub-pixel.

7. The display substrate according to claim 1, wherein a distance between adjacent third sub-pixels in the second sub-display region is greater than a distance between adjacent second sub-pixels in the first sub-display region, and/or,
   a size of the second sub-pixel is less than a size of the third sub-pixel.

8. The display substrate according to claim 1, wherein the first electrode comprises a plurality electrode blocks, the plurality of electrode blocks are disposed at intervals in the first direction, and the first electrode further comprises at least one connecting portion, for each of the at least one connecting portion, the connecting portion electrically connects two adjacent electrode blocks, and the light-emitting structure comprises a plurality of light-emitting blocks disposed correspondingly on the plurality of electrode blocks; and
   the at least one connecting portion of the first electrode and the plurality of electrode blocks of the first electrode are disposed on a same layer, wherein the first direction indicates a row direction or a column direction.

9. The display substrate according to claim 1, wherein an edge of the conductive layer may be arc-shaped or wave-shaped at least partially.

10. The display substrate according to claim 1, wherein the first electrode comprises a plurality of electrode blocks, the plurality of electrode blocks are arranged at intervals in the first direction, and the first electrode further comprises at least one connecting portion, and each of the at least one connecting portion electrically connects two adjacent electrode blocks, wherein
    the first direction indicates a row direction or a column direction.

11. The display substrate according to claim 10, wherein the wiring for the first electrode is electrically connected to one electrode block of the first electrode.

12. The display substrate according to claim 10, wherein an orthographic projection of each of the plurality of electrode blocks on the substrate comprises a first pattern unit or a plurality of first pattern units; and/or
    the light-emitting structure comprises a plurality of light-emitting structure blocks disposed correspondingly on the plurality of electrode blocks, and an orthographic projection of each of the plurality of light-emitting structure blocks on the substrate comprises a second pattern unit or a plurality of second pattern units.

13. The display substrate according to claim 10, wherein two adjacent electrode blocks of the plurality of electrode blocks of the same first electrode are arranged staggered in a second direction which is perpendicular to the first direction.

14. The display substrate according to claim 1, wherein the first electrode comprises a plurality of electrode blocks, the plurality of electrode blocks are disposed at intervals in the first direction, and the first electrode further comprises at least one connecting portion, for each of the at least one connecting portion, the connecting portion electrically connects two adjacent electrode blocks, and the light-emitting structure comprises a plurality of light-emitting structure blocks disposed correspondingly on the plurality of electrode blocks; and the at least one connecting portion of the first electrode and the plurality of electrode blocks are located on different layers, and a second insulating layer is disposed between the at least one connecting portion and the plurality of electrode blocks, the second insulating layer is provided with a contact hole, and the connecting portion is electrically connected to a corresponding electrode block via the contact hole; wherein the first direction indicates a row direction or a column direction.

15. The display substrate according to claim 14, wherein the display substrate further comprises a pixel definition layer disposed on the first electrode, the pixel definition layer is provided with a plurality of pixel openings are disposed in the pixel definition layer, the plurality of light-emitting structure blocks are disposed in the plurality of pixel openings in a one-to-one correspondence, and a distance between an edge of the contact hole and an edge of a corresponding pixel opening ranges from 4 μm to 30 μm.

16. The display substrate according to claim 15, wherein the connecting portion comprises a third segment and a plurality of fourth segments connected to the third segment, the fourth segment is configured to electrically connect to the electrode block, and the third segment extends in the first direction, the fourth segment extends in the second direction, and the fourth segments are arranged at intervals in the first direction, the third segment and the fourth segment are arc-shaped or wave-shaped, the second direction is perpendicular to the first direction.

17. A display panel, comprising:
the display substrate according to claim 1; and
an encapsulation layer;
wherein the encapsulation layer comprises a polarizer, and the polarizer is disposed in one of following manners:
the polarizer covering the second display region; and
the polarizer covering the second display region and the first display region.

18. A display device, comprising:
a device body having a device area; and
the display panel according to claim 17, covering the device body;
wherein the device area is disposed under the first display region, and a photosensitive device that emits light or collects light passing through the first display region is disposed in the device area.

* * * * *